United States Patent
Apte et al.

(10) Patent No.: US 10,186,179 B2
(45) Date of Patent: Jan. 22, 2019

(54) CURRENT-ACTUATED-DISPLAY BACKPLANE TESTER AND METHOD

(75) Inventors: Raj B. Apte, Palo Alto, CA (US); Jeng Ping Lu, San Jose, CA (US); Jackson H. Ho, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 621 days.

(21) Appl. No.: 12/408,219

(22) Filed: Mar. 20, 2009

(65) Prior Publication Data
US 2010/0237244 A1 Sep. 23, 2010

(51) Int. Cl.
  *G01R 3/00* (2006.01)
  *G09G 3/00* (2006.01)
  *G01R 31/308* (2006.01)
  *G09G 3/3208* (2016.01)

(52) U.S. Cl.
  CPC ........... *G09G 3/006* (2013.01); *G01R 31/308* (2013.01); *G09G 3/3208* (2013.01); *G09G 2360/147* (2013.01)

(58) Field of Classification Search
  CPC .................................. G09G 3/36; G01R 31/26
  USPC ......... 250/338.1; 324/765, 767, 770; 356/51
  See application file for complete search history.

(56) References Cited

U.S. PATENT DOCUMENTS

| | | | |
|---|---|---|---|
| 5,089,700 A * | 2/1992 | Sapia et al. | 250/330 |
| 5,309,108 A | 5/1994 | Maeda et al. | |
| 6,111,424 A | 8/2000 | Bosacchi | |
| 7,295,030 B2 | 11/2007 | Imura et al. | |
| 7,474,115 B1 * | 1/2009 | Trujillo et al. | 324/762.07 |
| 8,536,892 B2 | 9/2013 | Apte | |
| 2002/0044124 A1 * | 4/2002 | Yamazaki et al. | 345/92 |
| 2006/0097745 A1 | 5/2006 | Imura et al. | |
| 2006/0152500 A1 * | 7/2006 | Weng | 345/173 |
| 2009/0218932 A1 * | 9/2009 | Wang | 313/504 |

FOREIGN PATENT DOCUMENTS

JP    4-72552 A    3/1992

OTHER PUBLICATIONS

European Search Report for EP 10 156 695.8 dated Feb. 25, 2011.

* cited by examiner

*Primary Examiner* — Michael C Bryant
(74) *Attorney, Agent, or Firm* — Fay Sharpe LLP

(57) ABSTRACT

A backplane test system is provided that uses a pressed or deposited resistive film and infra-red (IR) imaging to visualize and quantify the current drive of pixels. In one form, the system is used for measuring organic light-emitting-diode (OLED) backplanes or other current-actuated-display (CAD) backplanes.

14 Claims, 4 Drawing Sheets

CURRENT-ACTUATED-DISPLAY BACKPLANE TESTER AND METHOD

BACKGROUND

Testing backplanes that drive current rather than voltage presents a challenging problem. At present, there is a need for an acceptable solution for measuring current actuated display (CAD) backplanes prior to application of a display medium to such backplanes.

Typically, backplanes are fabricated with test structures that allow general parametric measurement of the substrate, without any detail pertaining to individual display elements (pixels, data lines, gate lines, ground busses, power busses). In this regard, with satisfactory substrate parameters, displays are then assembled with a medium (e.g. an organic light emitting diode (OLED)). The finished displays may then be imaged with a camera to measure uniformity, area defects, line defects, and pixel defects. However, with these types of testing systems, problems cannot be detected until after the display is completed.

A variety of testers for AMLCD backplanes are known. However, none are known for OLED backplanes.

Also, U.S. Pat. No. 7,295,030 teaches the use of a vacuum tip to capture current without contact. However, a convenient visual system is not disclosed.

BRIEF DESCRIPTION

In one aspect of the presently described embodiments, the backplane test system comprises conductive connections to circuit elements of the backplane, a drive circuit to selectively drive the circuit elements through the conductive connections, a resistive layer over the backplane to cover the circuit elements, and, an infrared camera to generate an infrared image of the resistive coating while the circuit elements are being driven.

In another aspect of the presently described embodiments, the conductive connections comprise contact pads connected to circuit elements via bus lines.

In another aspect of the presently described embodiments, the conductive connections comprise conductive tape elements.

In another aspect of the presently described embodiments, the resistive layer is applied by one of spinning, evaporation, blading and pressing.

In another aspect of the presently described embodiments, the resistive layer is comprised of one of indium tin oxide (ITO), PEDOT, tungsten, titanium and carbon.

In another aspect of the presently described embodiments, the resistive layer is a rubber material.

In another aspect of the presently described embodiments, the resistive layer is transparent.

In another aspect of the presently described embodiments, the backplane is used for organic light emitting diode (OLED) applications.

In another aspect of the presently described embodiments, the infrared imager comprises one of a CCD, CMOS and InSb-QW imagers.

In another aspect of the presently described embodiments, the method comprises forming a resistive layer on a backplane to cover circuit elements, selectively activating the circuit elements and generating an infrared image of the resistive layer during the selective actuation.

In another aspect of the presently described embodiments, the forming comprises one of spinning, evaporating, blading and pressing.

In another aspect of the presently described embodiments, the resistive layer is one of indium tin oxide (ITO), PEDOT, tungsten, titanium and carbon.

In another aspect of the presently described embodiments, the resistive layer is a rubber material.

In another aspect of the presently described embodiments, the resistive layer is transparent.

In another aspect of the presently described embodiments, the backplane is implemented in an organic light emitting diode application.

In another aspect of the presently described embodiments, the infrared image generating is accomplished by one of a CCD, CMOS or InSb-QW device.

DETAILED DESCRIPTION

The presently described embodiments are directed to a backplane test system using a pressed or deposited resistive film or layer and infra-red (IR) imaging to visualize and quantify the current drive of pixels. It is particularly suited, in one form, for measuring organic light-emitting-diode (OLED) backplanes or other current-actuated-display (CAD) backplanes.

The presently described embodiments use infra-red imaging to observe heating in a resistive layer applied to a current-driving backplane. In one form, a functional backplane is completed and the shorting bars are removed, by, for example, parting the substrate, scribing, or other means. A resistive coating is applied or pressed, in any of a variety of manners, to the surface of the array. In one form, flexible contact tapes are pressed onto the row and column electrode pads to make contact with the bus lines. A separate contact tape (or other conductive lead material) is also applied to the resistive coating, which may also or alternatively have a guard-ring type electrode to simplify contact. The contacts on the tapes are then selectively driven with signals to turn on one or several pixels in any of a variety of known manners. In one form, the guard-ring electrode is driven to a suitable voltage, possibly ground, and an IR image is taken of the array. Assuming the conductivity of the resistive layer is uniform, the temperature of the resistive layer above a given pixel may be measured for a variety of pixel inputs, including grey scale. The pattern of active pixels may then be varied to test all or a plurality thereof.

Figure 1A:
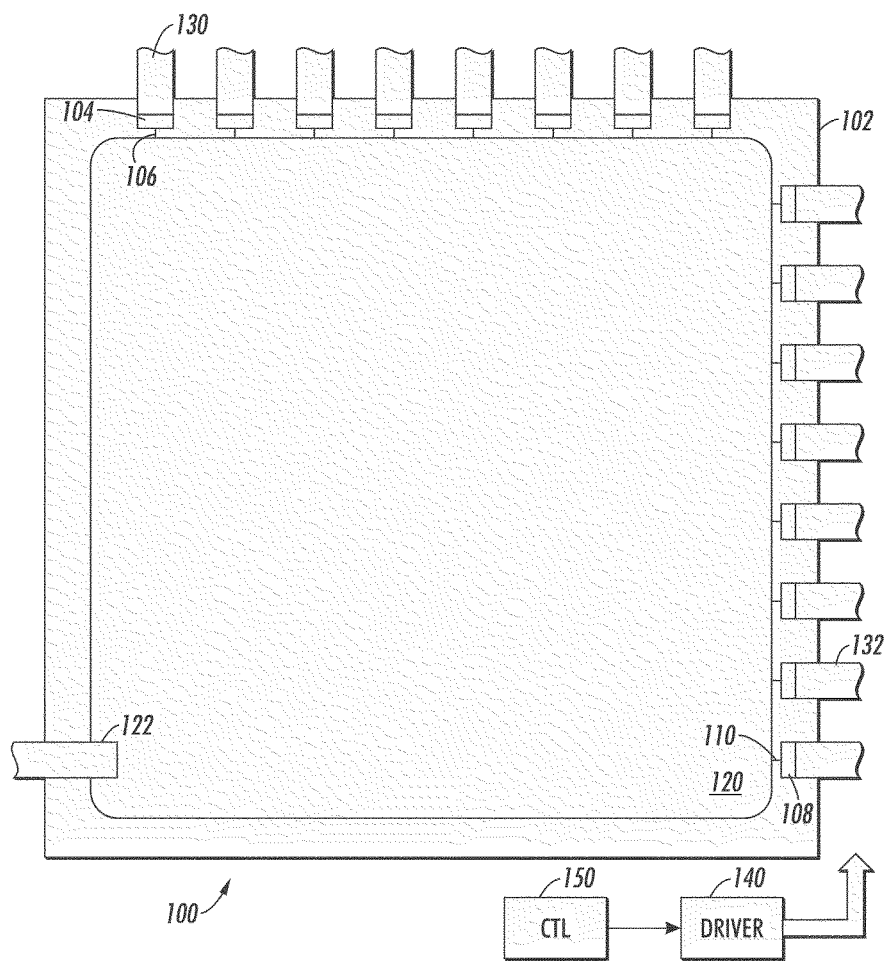
FIGS. 1(a) and (b) are block diagrams of exemplary systems according to the presently described embodiments.

With reference now to FIG. 1(a), an example system according to the presently described embodiments is illustrated. In this regard, the system 100 includes a backplane 102. As noted above, the backplane 102 may take a variety of forms, such as an OLED backplane or other CAD backplane. In any case, the backplane has formed thereon column contact pads (such as column pad 104) connected to column bus lines (such as bus line 106). The backplane 102 also has row contact pads (such as row contact pad 108) connected to row bus lines (such as bus line 110). The circuit may vary by application, however.

The complete circuitry of the backplane 102 is not shown for ease of reference. However, according to the presently described embodiments, a resistive coating 120 is formed over such circuitry and is provided with a conductive connection, e.g. conductive tape, 122 (in addition to the existing conductive connection of the bus lines and contact pads) to drive the voltage of the coating 120 to a suitable level (e.g. ground). Similarly, each column contact pad has connected thereto a conductive connection or lead (such as conductive tape element 130). Likewise, each row contact pad has connected thereto a conductive connection or lead (such as conductive tape element 132). The conductive connections or leads are illustrated as conductive tape, but other types of conductive connections may be used.

With this configuration, the column contact pads and the row contact pads can be selectively driven to various voltage levels using a driver circuit 140 controlled by controller 150. It should be appreciated that, although not shown, the connections between the driver 140 and the conductive tape elements that, in one form, connect to the various contact pads, can be accomplished in any of a variety of known manners. Also, the driver circuit 140 and controller 150 may take a variety of forms depending on the implementation. These devices may be separate devices, a single device, and/or may be implemented using a variety of hardware configurations and software techniques.

Figure 1B:
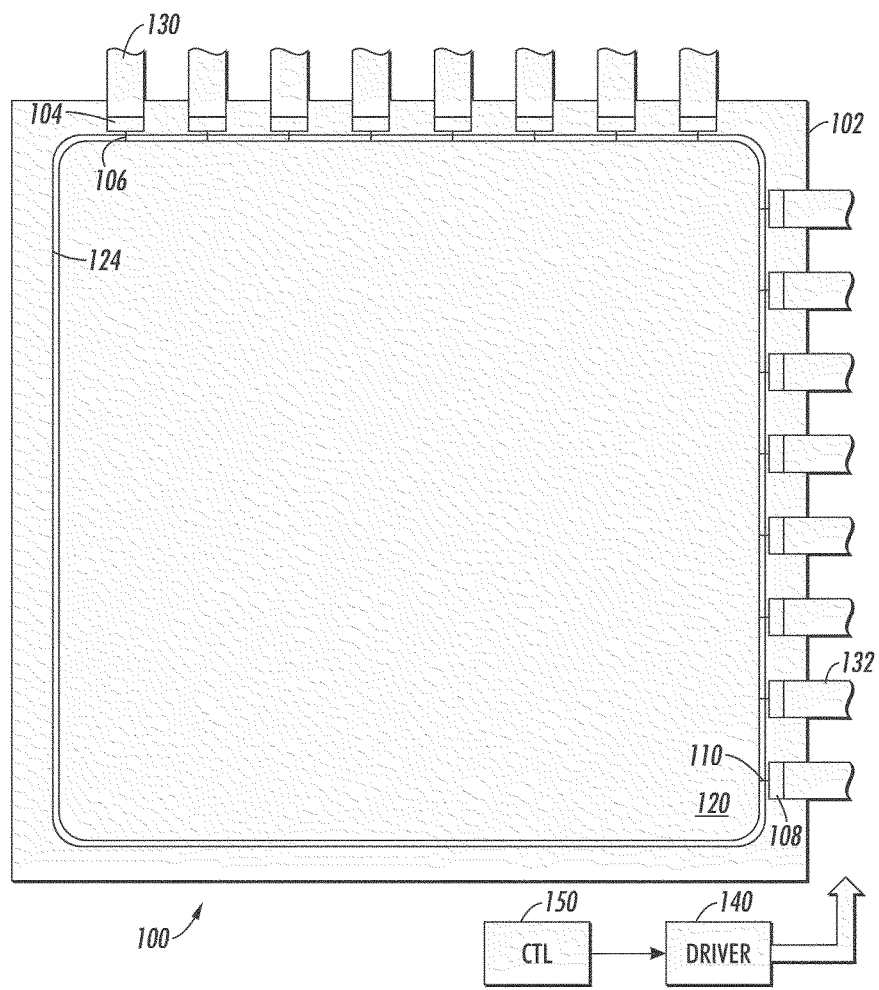

Referring to FIG. 1(b), an alternative system is shown. In this system, the conductive tape 122 is not used. Rather, a guard ring electrode 124 is shown. The guard ring electrode 124 can be driven to a voltage, e.g. ground, during imaging of an array.

Figure 2:
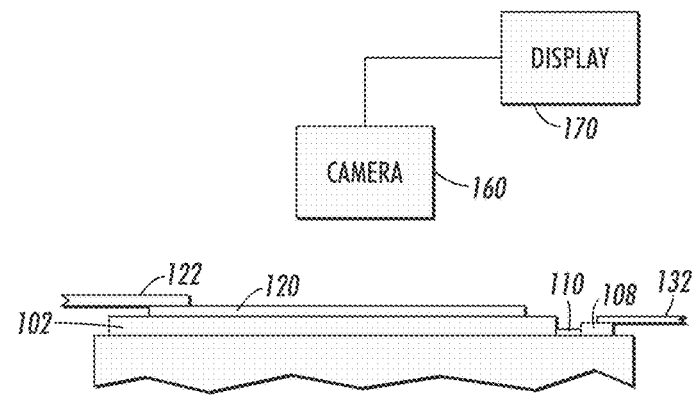
FIG. 2 is a side view of the system of FIG. 1(a) according to the presently described embodiments.

With reference now to FIG. 2 (which is a side view of the system shown in FIG. 1(a)), it will be appreciated that the system 100 is further provided with an infrared camera 160—as well as a suitable display device 170. FIG. 2 is a side view of the system 100 and shows the backplane 102, row contact pad 108, row bus line 110 and resistive coating 120. Also shown are the conductive tape element 122 and conductive tape element 132. It should be appreciated that camera and display device are also applicable to the system shown in FIG. 1(b).

As alluded to above, in operation, after the backplane is coated with the conductive layer 120, the contact pads can be selectively driven to voltage levels so that individual circuit elements react such that an effect is achieved in the resistive coating. It should be appreciated that the selective actuation of the circuit elements may be based on any of a variety of routines or methods implemented and/or controlled by the driver/controller combination that will allow for a suitable analysis of the resultant data. The resistive coating is then imaged by the infrared camera to provide information for analysis of the underlying backplane circuit. Of course, the analysis may take a variety of forms and may differ as a function of the precise implementation. In one form, a generated infrared image is displayed on the display device 170 for analysis.

Figure 3:
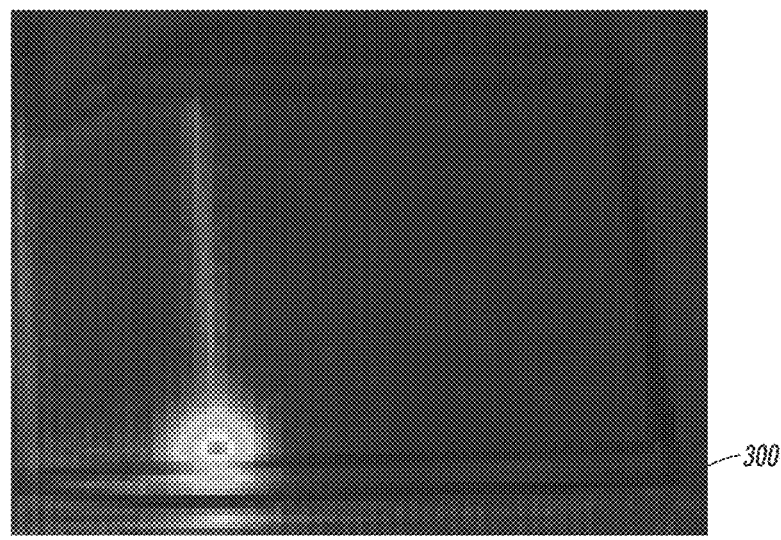
FIG. 3 is an example infrared image of a polysilicon array showing an active pixel defect; and, FIG. 4 is a graph showing relative resistance from a center of a resistively-coated array being tested to an edge-midpoint and corner thereof.

An example infrared image is shown in FIG. 3. This image 300 of a polysilicon array was taken with an IRRIS-256 IR camera. No resistive layer has been applied—in this case the image is of a short in a very complex, high-frequency-sensor pixel design. Nevertheless, it illustrates the ability of infrared imaging to show fine detail thermometry.

The resistive layer 120 may be formed in a variety of manners. For example, it may be spun, evaporated, bladed, pressed, or otherwise applied. In one form, its sheet resistivity is compatible with the drive current and voltage of the pixel design and the deposition and removal processes are compatible with subsequent array processing. Sample materials include sputtered or solution-deposited particulate ITO, PEDOT, Tungsten, Titanium, and various forms of Carbon. For example, ethanol-deposited particulate ITO may produce a sheet resistivity of 10 M$\Omega$/sq, suitable for a drive transistor that operates at 5V and 20 µA, and may be removed with ethanol. Because the array will typically have contact pads with lower sheet resistance, the actual conductivity of the top layer will be a function of geometry, pad resistance, and the resistive layer. Because the top array surface usually consists of passivation and pad metal, a wide variety of resistive film removal methods may be acceptable.

Rubber material may be used as the resistive layer 120 because it may be rendered conductive by percolation of charge—through conductive particles embedded in the material. In one form, multi-form carbon is used in silicone rubber, although metal particles may be used as well.

In this regard, thin sheets of rubber-laminated substrates may be used as the resistive layer. The substrate may be electrically conductive, or the guard ring method may be used.

One application for current-driver backplanes is for OLEDs, for which stainless steel is often used as a backplane. The thermal conductivity is 16 times higher for stainless than glass, so, depending on the thickness of the buffer layers, there may be a thermal sink to the substrate. This will vary according to specific substrates and designs.

Three methods may be employed to improve the signal in such cases. First, polymeric materials, which are much less thermally conductive, may be used for the buffer layer. Specific thermal shunt resistance would be analyzed for specific designs. Note that joule heating in the driver transistor itself may have a very different thermal shunt resistance than the applied resistive layer.

Second, a variety of IR imaging systems and techniques are available and could be used to improve performance. For example, CCD, CMOS, InSb-QW, with various levels of cooling, could be used. Sensitivities are down to 60°mK for various devices and high megapixel cameras are available.

Third, the infrared cameras may be used stroboscopically. This makes sense under pulsed operation to detect peak power, which may be substantially higher than average power. Depending on the thermal conductivity and capacity, pulsed heating and image averaging may produce a superior image.

Figure 4:
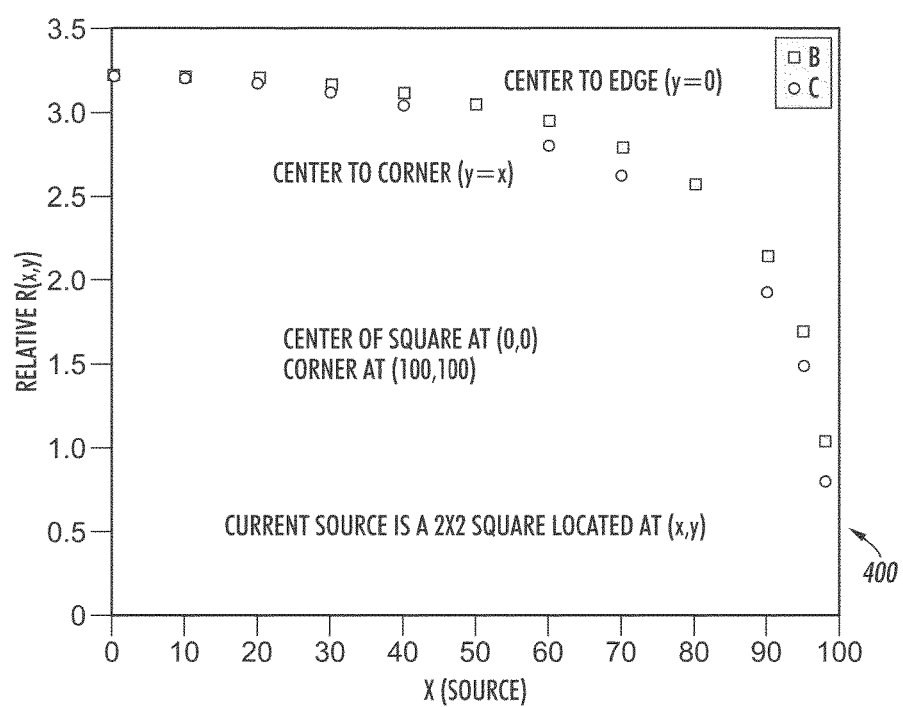

In addition, although a number of approaches may be used (including the conductive tape 122 of FIG. 1(a)), guard ring current shunting, as shown in FIG. 1(b), may be the simplest current return mechanism. In this case, the resistance at any given pixel will depend on the coordinate of that pixel—those nearest the guard ring will have a lower resistance than in the array center. However, in at least one form, finite-element analysis 400 shown in FIG. 4 indicates that the guard ring diameter need be only 20% larger than the array to keep the pixel resistances substantially constant. In FIG. 4, relative resistance (RELATIVE R(x,y)) for positions X from the center of the array to the edge-midpoint (y=0) (data points shown as squares (B) in FIG. 4) and from the center of the array to a corner (y=x) (data points shown as circles (C) in FIG. 4).

Given that pixels may be driven over a variety of gray levels, this method may be able to detect linearity, threshold, and saturation effects.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A system for testing a current actuated display backplane having circuit elements disposed thereon, the system comprising:
    conductive connections to the circuit elements;
    a drive circuit to selectively drive the circuit elements through the conductive connections;
    a resistive layer pressed on the backplane to cover the circuit elements, the resistive layer being provided with an element to drive voltage to a certain level and having resistivity compatible with the circuit elements; and,
    an infrared camera to generate an infrared image of the resistive layer while the circuit elements are being driven to observe heating in the resistive layer.

2. The system as set forth in claim 1 wherein the conductive connections comprise contact pads connected to circuit elements via bus lines.

3. The system as set forth in claim 2 wherein the conductive connections comprise conductive tape elements.

4. The system as set forth in claim 1 wherein the resistive layer is comprised of one of indium tin oxide (ITO), PEDOT, tungsten, titanium and carbon.

5. The system as set forth in claim 1 wherein the resistive layer is a rubber material.

6. The system as set forth in claim 1 wherein the resistive layer is transparent.

7. The system as set forth in claim 1 wherein the backplane is used for organic light emitting diode (OLED) applications.

8. The system as set forth in claim 1 wherein the infrared imager comprises one of a CCD, CMOS and InSb-QW imagers.

9. A method for testing current actuated display backplanes having circuit elements disposed thereon, the method comprising:
    pressing a resistive layer on the backplane to cover the circuit elements, the resistive layer being provided with an element to drive voltage to a certain level and having resistivity compatible with the circuit elements;
    selectively actuating the circuit elements; and,
    generating an infrared image of the resistive layer during the selective actuation to observe heating in the resistive layer.

10. The method as set forth in claim 9 wherein the resistive layer is one of indium tin oxide (ITO), PEDOT, tungsten, titanium and carbon.

11. The method as set forth in claim 9 wherein the resistive layer is a rubber material.

12. The method as set forth in claim 9 wherein the resistive layer is transparent.

13. The method as set forth in claim 9 wherein the backplane is implemented in an organic light emitting diode application.

14. The method as set forth in claim 9 wherein the infrared image generating is accomplished by one of a CCD, CMOS or InSb-QW device.

* * * * *